US006538257B2

(12) United States Patent
Bisschops

(10) Patent No.: US 6,538,257 B2
(45) Date of Patent: Mar. 25, 2003

(54) METHOD OF GENERATING EXTREMELY SHORT-WAVE RADIATION, AND EXTREMELY SHORT-WAVE RADIATION SOURCE UNIT

(75) Inventor: Theodorus Hubertus Josephus Bisschops, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 146 days.

(21) Appl. No.: 09/726,780

(22) Filed: Nov. 30, 2000

(65) Prior Publication Data

US 2001/0006217 A1 Jul. 5, 2001

(30) Foreign Application Priority Data

Dec. 23, 1999 (EP) .............................. 99204500

(51) Int. Cl.$^7$ ........................... G21G 4/00; G01J 00/00; H05H 00/00; G21K 1/02
(52) U.S. Cl. ............................. 250/493.1; 250/492.3; 250/492.1; 378/119; 378/148
(58) Field of Search .................. 355/71, 69; 250/492.2, 250/492.22, 493.1; 378/143, 119

(56) References Cited

U.S. PATENT DOCUMENTS

| | | | | |
|---|---|---|---|---|
| 4,700,371 A | * | 10/1987 | Forsyth et al. | ........... 250/492.2 |
| 4,860,328 A | | 8/1989 | Frankel et al. | ............... 378/34 |
| 4,866,517 A | * | 9/1989 | Mochizuki et al. | ......... 378/119 |
| 5,151,928 A | * | 9/1992 | Hirose | ..................... 250/483.1 |
| 5,153,898 A | | 10/1992 | Suzuki et al. | ................. 378/34 |
| 5,832,007 A | * | 11/1998 | Hara et al. | ................... 372/103 |
| 6,320,937 B1 | * | 11/2001 | Mochizuki | .................. 378/143 |

FOREIGN PATENT DOCUMENTS

| | | |
|---|---|---|
| EP | 0779528 A2 | 6/1997 |
| EP | 0957402 A2 | 11/1999 |
| WO | 9733204 A1 | 9/1997 |

OTHER PUBLICATIONS

Database WPI—XP 002162344.
"Characterization and Control of Laser Plasma Flux Parameters for Soft X–Ray Projection Lithography", in Applied Optics, vol. 32, No. 34, Dec. 1, 1993, pp. 6901–6910.
"Exit Flow Properties of Annular Jet–Diffuser Ejectors", in Journal of the Chinese Society of Mechinical Engineers, vol. 18, No. 2, 1997, pp. 1113–1125.
"Front–end Design issues in Soft X–Ray Lithography" in Applied Optics, vol. 23, No. 34, Dec. 1, 1993, pp. 7050–7056.
"Performance Optimization of a High–Repetition–Rate KrF Laser Plasma X–Ray Source for Microlithography", in Journal of X–Ray Science and Technology, vol. 3, 1992, pp. 133–151.

* cited by examiner

Primary Examiner—Jack Berman
Assistant Examiner—Kalimah Fernandez
(74) Attorney, Agent, or Firm—Aaron Waxler

(57) ABSTRACT

A method of generating EUV radiation is described, comprising the steps of:
  transporting a solid medium (33) through a source space (34) connected to a vacuum pump (35), and
  irradiating a portion (37) of the medium with an intense, pulsed, laser beam (41) focused on said portion of the medium, thus creating a plasma (47) which emits EUV radiation.

To increase the intensity of the EUV radiation and improve the possibility to collect particles (51, 52, 53) released from the medium, at least the medium portions (37) to be irradiated have a concave shape. The method can be improved by embedding the medium in a flow of rare gas.

Also described are a EUV radiation source unit for realizing the method and the application of the method in the manufacture of devices such as IC devices, and in a lithographic projection apparatus.

19 Claims, 8 Drawing Sheets

METHOD OF GENERATING EXTREMELY SHORT-WAVE RADIATION, AND EXTREMELY SHORT-WAVE RADIATION SOURCE UNIT

BACKGROUND OF THE INVENTION

The invention relates to a method of generating extremely short-wave radiation, in which a solid medium is transported through a vacuum space and each time a different part of the medium in the vacuum space is irradiated with a pulsed and focused energy-rich laser beam, said part of the medium being partly converted into a plasma emitting extremely short-wave radiation.

The invention also relates to a method of manufacturing a device by means of this radiation. Furthermore, the invention relates to an extremely short-wave radiation source unit and to a lithographic projection apparatus provided with such a radiation source unit.

Extremely short-wave radiation is understood to mean extreme UV (EUV) radiation, which can be used in lithographic projection apparatuses, and X-ray radiation for various applications.

A solid medium is understood to be a medium such as a metal having a solid shape which can be locally exploded by laser beam bombardment, in which the released particles form a plasma emitting extremely short-wave radiation. The metal medium may be a tape or a wire transported through the vacuum, or source space.

The article "Characterization and control of laser plasma flux parameters for soft X-ray projection lithography" in: Applied Optics, Vol. 32, No. 34, Dec. 1, 1993, pp. 6901–6910 describes a method of generating EUV radiation for use in a lithographic apparatus, using a rotating disc of tin (Sn) as a mobile medium.

A lithographic apparatus is used, inter alia, in the manufacture of integrated electronic circuits or ICs for imaging an IC mask pattern, present in a mask, each time on a different IC area of a substrate. This substrate, which is coated with a radiation-sensitive layer, provides space for a large number of IC areas. The lithographic apparatus may also be used in the manufacture of, for example, liquid crystalline image display panels, integrated, or planar optical systems, charge-coupled detectors (CCDs) or magnetic heads.

Since an increasingly large number of electronic components is to be accommodated in an IC, increasingly smaller details, or line widths, of IC patterns must be imaged. Consequently, increasingly stricter requirements are imposed on the imaging quality and the resolving power of the projection system in the apparatus, which projection system is generally a lens system in the current lithographic apparatuses. The resolving power, which is a measure of the smallest detail which can still be imaged, is proportional to $\lambda/NA$, in which $\lambda$ is the wavelength of the imaging, or projection, beam and NA is the numerical aperture of the projection system. To increase the resolving power, the numerical aperture may, in principle, be enlarged and/or the wavelength may be reduced. An increase of the currently already fairly large numerical aperture is no longer very well possible in practice because the depth of focus of the projection system, which is proportional to $\lambda/NA^2$, will become too small and the correction for the required image field will be too difficult.

The requirements to be imposed on the projection system may be mitigated, or the resolving power may be increased while these requirements are maintained if a step-and-scan lithographic apparatus is used instead of a stepping lithographic apparatus. In a stepping apparatus, a full-field illumination is used, i.e. the entire mask pattern is illuminated in one run and imaged as one whole on an IC area of the substrate. After a first IC area has been illuminated, a step is made to a subsequent IC area, i.e. the substrate holder is moved in such a way that the next IC area is positioned under the mask pattern, whereafter this area is illuminated, and so forth, until all IC areas of the substrate are provided with a mask pattern. In a step-and-scan apparatus, only a rectangular or annular segment-shaped area of the mask pattern and hence a corresponding sub-area of a substrate IC is illuminated, and the mask pattern and the substrate are synchronously moved through the illumination beam, while taking the magnification of the projection system into account. A subsequent area of the mask pattern is then each time imaged on a corresponding sub-area of the relevant IC area of the substrate. After the entire mask pattern has been imaged on an IC area in this way, the substrate holder performs a step, i.e. the start of a subsequent IC area is introduced into the projection beam and the mask is set, for example, to its initial position whereafter said subsequent IC area is scan-illuminated via the mask pattern.

If even smaller details are to be satisfactorily imaged with a step-and-scan lithographic apparatus, the only possibility is to reduce the wavelength of the projection beam. In the current step-and-scan apparatuses, deep UV (DUV) radiation is already used, i.e. radiation having a wavelength of the order of several hundred nanometers, for example, 248 nm or 193 nm from, for example, an excimer laser. Another possibility is the use of extreme UV (EUV) radiation, also referred to as soft X-ray radiation, with a wavelength in the range of several nm to several tens of nm. Extremely small details, of the order of 0.1 $\mu$m or smaller, can be satisfactorily imaged with such a radiation.

Since there is no suitable lens material available for EUV radiation, a mirror projection system must be used for imaging the mask pattern on the substrate, instead of a hitherto conventional lens projection system. For forming a suitable illumination beam of the radiation from the EUV radiation source, mirrors are also used in the illumination system. The article "Front-end design issues in soft-X-ray lithography" in Applied Optics, Vol. 23, No. 34, Jan. 12, 1993, pp. 7050–56 describes a lithographic apparatus in which EUV radiation is used and whose illumination system comprises three mirrors and the imaging, or projection, system comprises four mirrors.

In EUV lithographic apparatuses, it is a great problem to illuminate the substrate at a sufficiently high intensity. A first cause of this problem, which applies to all EUV apparatuses, is that the mirrors used are considerably less than 100% reflecting. Each of these mirrors has a multilayer structure whose composition is adapted as satisfactorily as possible to the wavelength of the projection beam used. Examples of such multilayer structures are described in U.S. Pat. No. 5,153,898. A multilayer structure, which is frequently mentioned in literature, is the structure consisting of silicon layers alternating with molybdenum layers. For radiation coming from a plasma source, these layers theoretically have a reflection of the order of 73% to 75%, but in practice the reflection is currently not larger than 65%. When said number of seven mirrors is used, each with a reflection of 68%, only 6.7% of the radiation emitted by the source reaches the substrate. For a lithographic apparatus, this means in practice that the illumination time should be relatively long in order to obtain the desired quantity of radiation energy on a substrate, and that the scanning velocity would be relatively small, particularly for a scanning apparatus. However, it is essential for these apparatuses that the scanning velocity is as high as possible and the illumination time is as short as possible so that the throughput, i.e. the number of substrates which can be illuminated per unit of time, is as high as possible. This can only be achieved with an EUV radiation source which supplies sufficient intensity.

However, the currently known laser plasma sources in which a solid medium, such as iron, are used, have a low EUV radiation output. A second problem, which particularly but not exclusively occurs when using these types of sources in lithographic apparatuses, is that medium particles having a large velocity may be released in an uncontrolled manner during laser beam bombardment of the medium. These particles may absorb EUV radiation generated in the source space and possibly damage mirrors arranged in this space. Via apertures in the wall of the source space, intended for passing EUV radiation, said particles may also reach other spaces of the apparatus and damage optical components in these spaces.

SUMMARY OF THE INVENTION

It is an object of the present invention to provide a method in which a higher efficiency of extremely short-wave radiation can be achieved and said problems in EUV sources, and similar problems in X-ray sources, can be obviated. To this end, this method is characterized in that use is made of a medium which, viewed in the direction of irradiation, has a concave shape at least at the area of the parts to be irradiated.

Since the laser beam is incident on a concave part of the medium, the particles released from the medium and about to form a plasma are focused in a small area. Consequently, a plasma is obtained with a higher density and a higher temperature. Since the EUV emissive power of the plasma is dependent on this density and temperature, the EUV radiation output will be increased considerably. Also the repelled medium particles which do not reach the plasma are concentrated by the focusing effect of the concave medium so that it will be simpler to collect these particles before they have their destructive effect.

A first embodiment of the method according to the invention is characterized in that use is made of a tape-shaped medium provided with pits.

By synchronization of the tape-feedthrough through the source space and the pulses of the laser, it can be achieved that a laser pulse is each time incident on a concave part of the tape so that the EUV generation process can be realized in a well-controlled manner.

A second embodiment of the method is characterized in that use is made of a tape-shaped medium which is bent width-wise.

A concave medium part is then automatically available for each laser pulse.

A third embodiment of the method is characterized in that use is made of a wire-shaped medium having a concave profile.

The wire shape of the medium provides advantages in connection with the vacuum-technical aspects of the radiation source.

Said embodiments are preferably further characterized in that a metal is used as a medium.

Various metals such as iron, carbon and tin are suitable as a medium.

A method which is improved as regards the collection of harmful medium particles is characterized in that the medium is embedded in at least a viscous flow of rare gas which is transported through the vacuum space parallel to the direction of movement of the medium.

Particles repelled by the medium and not being drained in a concentrated form, and particles which are as yet repelled by the plasma can be taken along by the flow of rare gas to a space where they cannot cause any damage. It is thereby achieved that the vacuum, or source, space remains sufficiently transparent to the extremely short-wave radiation, and it is sufficiently prevented that said particles of the medium can penetrate other spaces of the apparatus in which the mirrors of the illumination system and those of the projection system are situated. The flow of rare gas is a viscous flow so that it exerts a sufficiently large suction on the matter to be removed. The flow is preferably a laminar flow so that a return flow of the rare gas, and the elements of the medium present therein, is suppressed very effectively.

The method is preferably further characterized in that two viscous flows of rare gas are passed through a part of the vacuum space in which a part of the medium, which is not yet irradiated, propagates.

By making use of two or more extra flows of rare gas, the velocity profile of the rare gas, which profile may be disturbed by an interaction of the moving medium with the rare gas, can be restored.

The method is preferably further characterized in that helium is used as a rare gas.

The envisaged object can be eminently realized with helium which is the lightest of the rare gases and absorbs little extremely short-wave radiation. Instead of helium, for example, also argon may be used, which, on the one hand, can better drain the medium elements but, on the other hand, is more absorbing than helium.

It is to be noted that the article "Characterization and control of laser plasma flux parameters for soft X-ray lithography" deals with the problem that may be caused by particles coming from the metal. It is proposed to fill the source space with helium at such a pressure that, on the one hand, collisions prevent the source particles from moving away from the source and, on the other hand, a minimal quantity of EUV radiation is absorbed by the helium. To this end, the helium must fill the entire source space so that more helium is required and the risk of absorption of EUV radiation is greater than in the radiation source unit according to the invention.

Furthermore, the article: "Performance Optimization of a High-Repetition-Rate KrF Laser Plasma X-ray Source for Microlithography" in: Journal of X-ray Science and Technology, 3-1992, pp. 133–151 notes that many absorbing and contaminating particles are released when an iron rod is used as a medium in a plasma source. To mitigate the drawbacks of these particles, this article proposes to use a tape-shaped medium instead of a rod-shaped one and to use a helium flow. This helium flow, with a pressure of 1 bar runs, however, parallel to the laser beam and is intended to protect the lens focusing the beam in the source space.

The invention also relates to a method of manufacturing a device, in which the dimensions of the smallest details are smaller than 0.25 $\mu$m, on a substrate, in which method different layers of the device are formed in successive steps by imaging by means of EUV radiation, for each layer, first a specific mask pattern on the substrate coated with a radiation-sensitive layer and by subsequently removing material from, or adding material to, areas marked by the mask image. This method is characterized in that the EUV radiation is generated by means of the method described hereinbefore.

The invention further relates to an extremely short-wave radiation source unit comprising:
- a source space connected on a first side to a vacuum pump;
- a transport device for transporting a solid medium through the source space;
- a pulsed high-power laser, and
- an optical system for focusing the laser beam supplied by the laser on a fixed position within the source space where the medium passes. This radiation source unit is characterized in that, in operation, the transport device is provided with a medium which, at given positions and viewed in the direction of the laser beam, has a concave shape.

A first embodiment of this radiation source unit is characterized in that the transport device is adapted to transport a tape-shaped medium which has pits which, viewed in the transport direction, are located one behind the other.

A second embodiment of the radiation source unit is characterized in that the transport device is adapted to transport a tape-shaped medium which is bent width-wise, the concave side facing the laser beam.

A third embodiment of the radiation source unit is characterized in that the transport device is adapted to transport a concave wire, whose concave side faces the laser beam.

Said embodiments are preferably further characterized in that the medium consists of a metal.

The radiation source unit preferably comprises a further provision for removing medium particles released during the plasma formation. A radiation source unit having such a provision is characterized in that the source space is connected on a second side, opposite the first side, to a rare gas inlet for establishing a viscous flow of rare gas in the source space enveloping the medium, which flow is parallel to the direction of movement of the medium.

A first embodiment of the radiation source unit having the extra provision, in which the source space is enclosed by a wall having apertures for causing the laser beam to enter into and exit from the source space and for causing the generated extremely short-wave radiation to exit from the source space, is characterized in that a tube is arranged in the source space on the second side of the source space and parallel to the direction of movement of the medium, which tube is connected to said inlet for establishing the viscous flow of rare gas.

This embodiment is preferably further characterized in that a second tube is arranged parallel to the first tube in the source space, which second tube is connected to said inlet for establishing a second viscous flow of rare gas parallel to the direction of movement of the medium.

A second embodiment of the radiation source unit having the extra provision is characterized in that the source space is formed by a first closed part on the first side, a second closed part on the second side and a central part which communicates with the ambience, in that the wall of the second source space part is formed by a tube which is connected to said rare gas inlet, and in that the wall of the tube and the wall of the first source space part have such a shape at the area of the central part of the source space that they constitute an ejector geometry.

Due to the extra suction caused by the ejector, or jet pump, geometry, it is prevented that rare gas and medium particles reach the apparatus spaces accommodating optical components.

A third embodiment of the radiation source unit having the extra provision is characterized in that the source space is formed by a first closed part on the first side, a second closed part on the second side and a central part which communicates with the ambience, in that the wall of the second source space part is formed by an annular tube which is connected to said rare gas inlet, and in that the wall of the tube and the wall of the first source space part have such a shape at the area of the central part of the source space that they constitute an annular ejector geometry.

As compared with the second embodiment, this embodiment has the advantage that the tube which is a part of the jet pump is narrow so that a satisfactory operation of this pump is ensured, and that it also provides the possibility to create some distance between the focus of the laser beam and the position where the medium passes. Especially for the case where the medium is a tape with pits, the risk that a pit is not impinged upon by the laser beam will be smaller. Since the density of the laser energy in this pit then remains limited, the number of energy-rich, troublesome medium particles may also remain limited.

Finally, the invention relates to a lithographic projection apparatus for imaging a mask pattern on a substrate provided with a radiation-sensitive layer, which apparatus comprises an illumination system for illuminating the mask pattern and a projection system for imaging the illuminated mask pattern on the substrate, the illumination system comprising an EUV radiation source, while the optical components of the illumination system and those of the projection system are present in a vacuum space. This apparatus is characterized in that the EUV radiation source is an EUV radiation source unit as described hereinbefore.

These and other aspects of the invention are apparent from and will be elucidated with reference to the embodiments described hereinafter.

DESCRIPTION OF THE PREFERRED EMBODIMENTS

Figure 1:
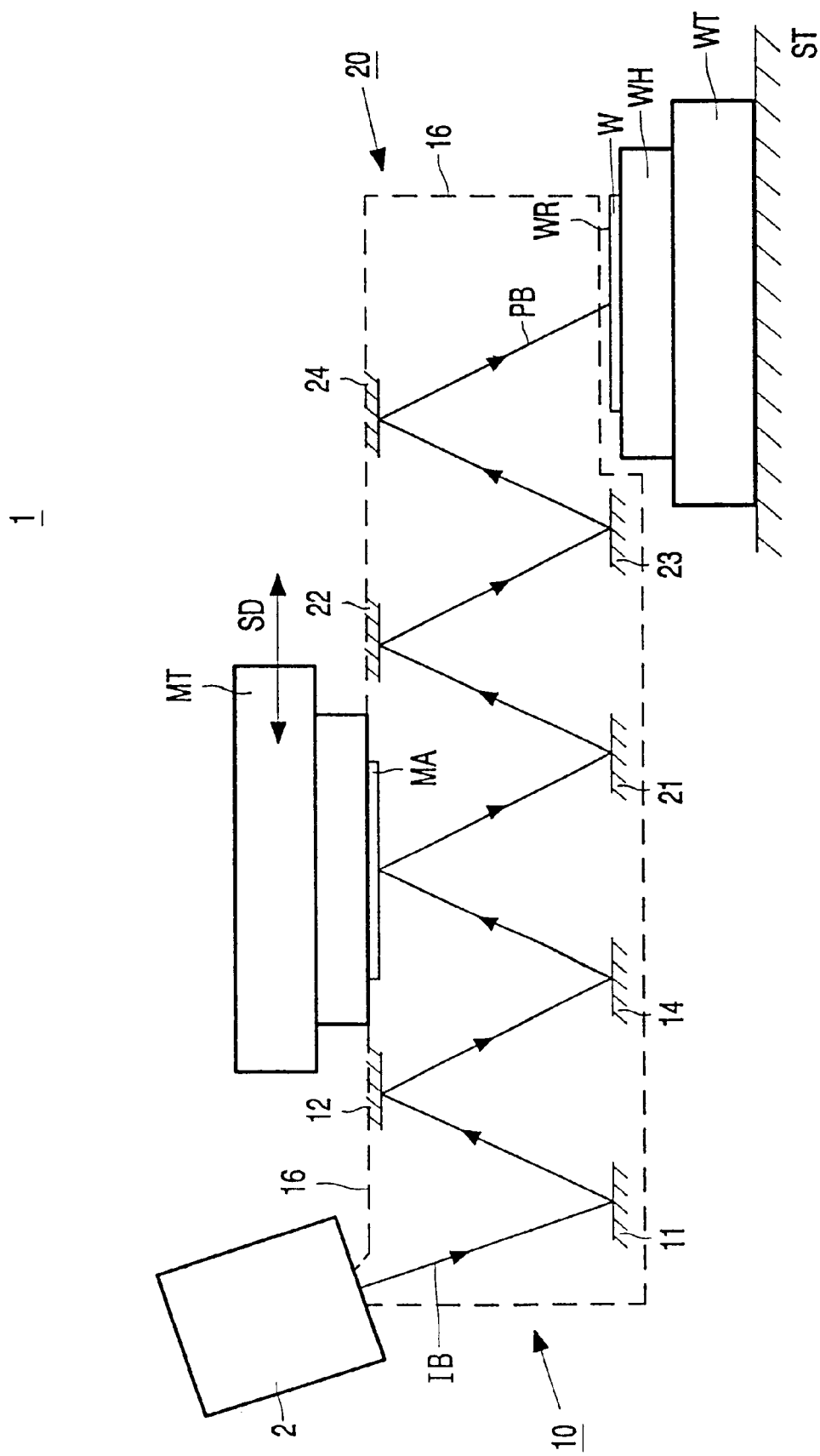
FIG. 1 shows a first embodiment of a step-and-scan lithographic projection apparatus in which the radiation source unit according to the invention may be used.

FIG. 1 shows diagrammatically an embodiment of a step-and-scan lithographic projection apparatus 1 in which an EUV radiation source according to the invention may be used and with which the method according to the invention may be performed. The apparatus comprises an illumination system for illuminating a mask MA and a mirror projection system for imaging a mask pattern, present in the mask, on a substrate W, for example, a semiconductor substrate which is provided with an EUV radiation-sensitive photoresist WR. The illumination system 10 shown in the left-hand part of FIG. 1 is designed in known manner in such a way that the illumination beam IB supplied by the system at the area of the ask MA has a cross-section in the form of an annular segment or a rectangle, and has a uniform intensity. The illumination system comprises, for example, three mirrors 11, 12 and 13 which are maximally reflecting for EUV radiation at, for example, a wavelength of the order of 13 nm because they have a multilayer structure of, for example, silicon layers alternating with molybdenum layers. The mask MA is arranged in a mask holder MH which forms part of a mask table MT. By means of this table, the mask can be moved in the scanning direction SD and possibly in a second direction perpendicular to the plane of the drawing, such that all areas of the mask pattern can be introduced under the illumination spot formed by the illumination beam IB. The mask table and the mask holder are shown only diagrammatically and may be constructed in different ways. The substrate W to be illuminated is arranged in a substrate holder WH which is supported by a substrate table WT, also referred to as stage. This table can move the substrate in the scanning direction SD but also in a direction perpendicular to the plane of the drawing. The substrate table is supported, for example, by a table bearing ST. For further details of a step-and-scan apparatus, reference is made by way of example to PCT patent application WO 97/33204 (PHQ 96004).

For imaging the mask pattern on the substrate with a reduction of, for example, 4×, a mirror projection system 20 comprising, for example, four mirrors 21, 22, 23 and 24 is arranged between the mask and the substrate. For the sake of simplicity, the mirrors are shown as plane mirrors but actually these mirrors, as well as those of the illumination system 10, are concave and convex mirrors and the mirror projection system 20 is designed in such a way that the desired sharp image is realized at a reduction of, for example 4×. The design of the mirror projection system does not form part of the present patent application. Analogously as the mirrors of the illumination system, each mirror 21, 22, 23 and 24 is provided with a multilayer structure of first layers having a first refractive index, alternating with second layers having a second refractive index.

Instead of four mirrors, the mirror projection system may alternatively comprise a different number of mirrors, for example, three, five or six. Generally, the accuracy of the image will be greater as the number of mirrors is larger, but there will be more radiation loss. Thus, a compromise will have to be found between the quality of the image and the radiation intensity on the substrate, which intensity also determines the velocity at which the substrates are illuminated and can be passed through the apparatus. Mirror projection systems having four, five or six mirrors for lithographic apparatuses are known per se. For example, a six-mirror system is described in EP-A 0 779 528.

Since EBV radiation is absorbed by air, the space in which this radiation propagates must be a highly vacuum-exhausted space. Minimally, both the illumination system, from the radiation source to the mask, and the projection system, from the mask to the substrate, must be arranged in a vacuum-tight space, which is denoted by means of an envelope 16 in FIG. 1. Instead of being accommodated in the same envelope, the illumination system and the projection system may be alternatively accommodated in separate envelopes.

Figure 2:
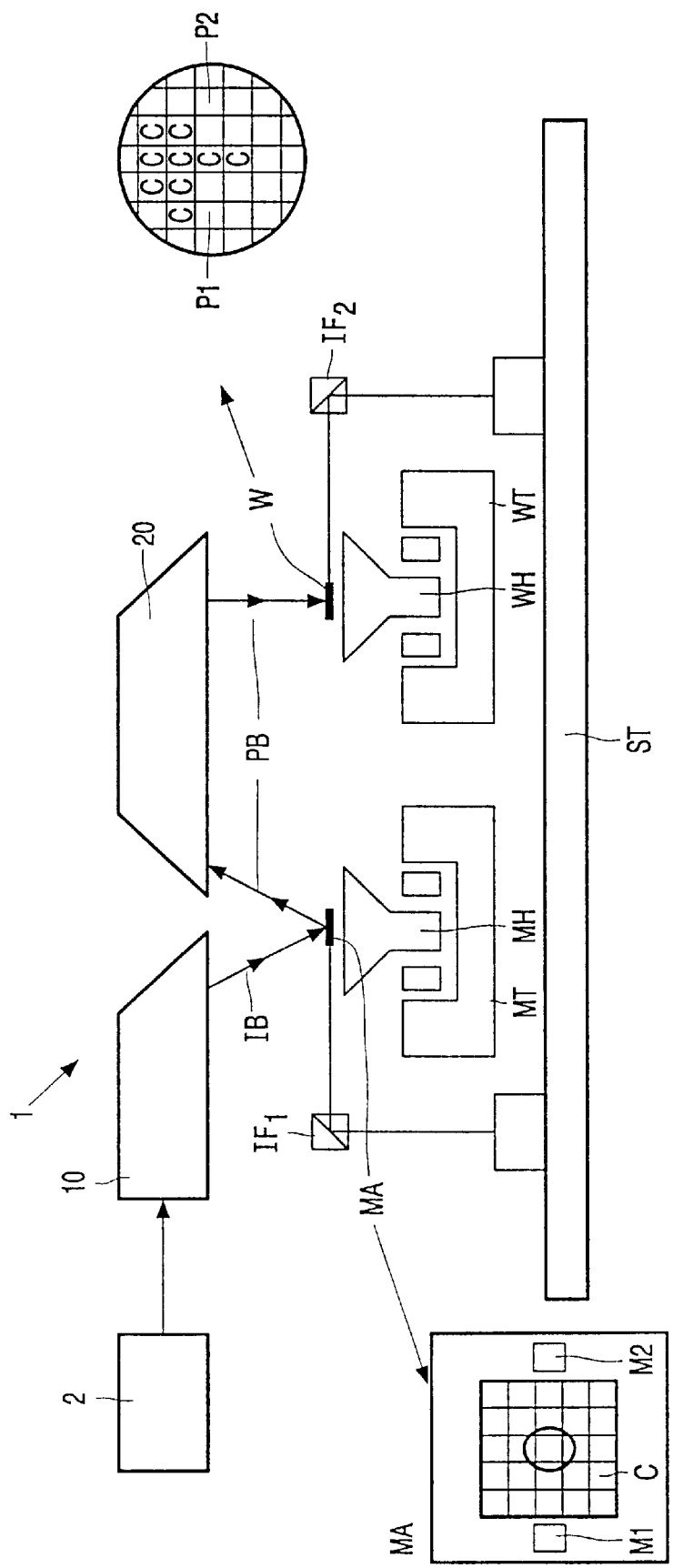
FIG. 2 shows a second embodiment of such an apparatus.

The mask MA and the substrate W may be juxtaposed, as shown in FIG. 2, instead of opposite each other. In this Figure, the components corresponding to those in FIG. 1 have the same reference numerals or symbols. The separate mirrors of the illumination system are not shown in FIG. 2 but form part of the block 10 representing the illumination system, with which the illumination beam is given the desired shape and the uniform intensity. FIG. 2 is a plan view of a mask with a mask pattern C and a plan view of a substrate W with substrate fields, with an image of the mask pattern C being formed on each field. The mask and the substrate comprise two or more alignment marks M1 and M2, and P1 and P2, respectively, each, which are used for aligning the mask pattern with respect to the substrate or with respect to each substrate field separately before the mask pattern is projected. For checking the movements of the mask and the substrate, the lithographic projection apparatus comprises very accurate measuring systems, preferably in the form of interferometer systems IF1 and IF2.

Figure 3:
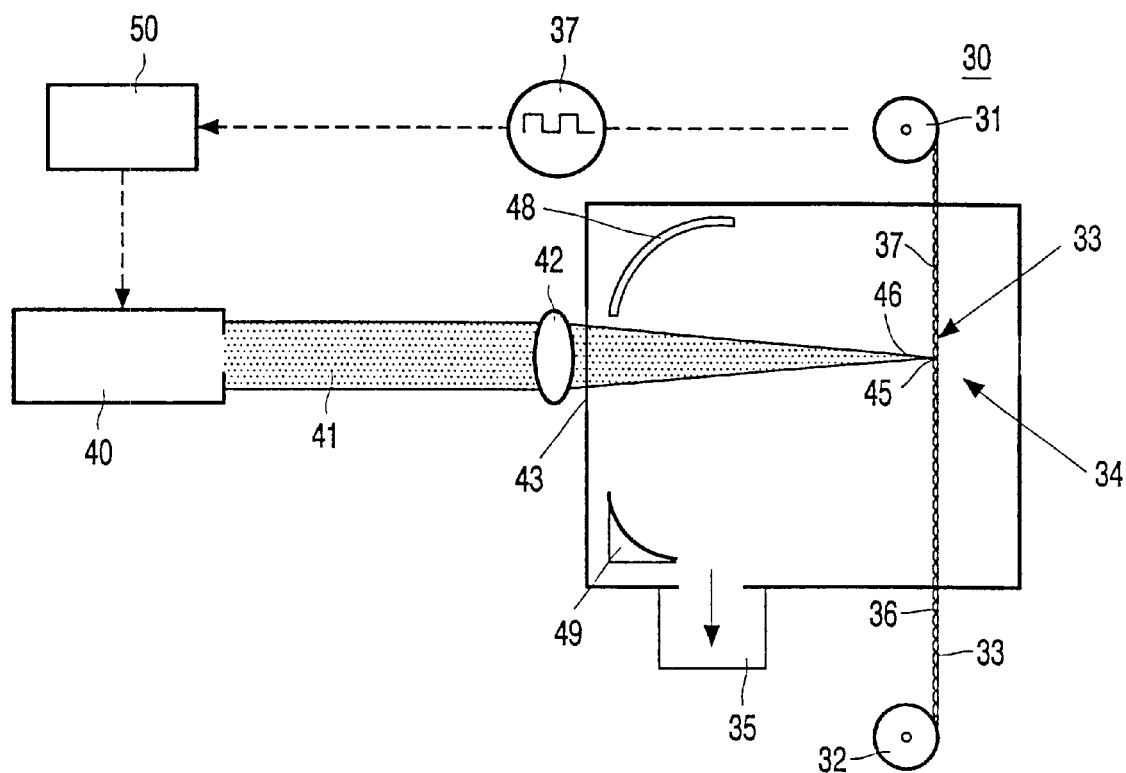
FIG. 3 is a cross-section of an EUV radiation source unit in which the invention is used.

The block denoted by reference numeral 2 in FIGS. 1 and 2 comprises an EUV radiation source unit in which EUV radiation is generated by irradiating a solid medium, for example, a metal with a high-intensity laser beam. FIG. 3 is a cross-section of an embodiment of such a radiation source unit. This unit comprises a transport device 30 in the form of, for example, a supply reel 31 and a take-up reel 32 for transporting a tape 33 of, for example, metal through a vacuum source space 34. This space is connected to a pump 35, for example, a turbo pump having a power of, for example, 1000 $dm^3$/sec, with which the space 34 can be pumped to a vacuum of $10^{-4}$ mbar.

Figure 4A:
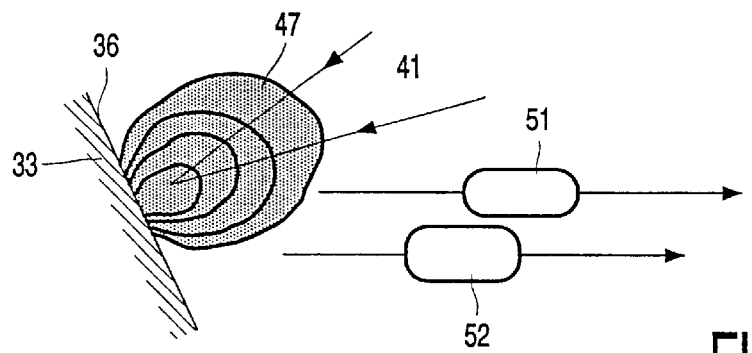
FIGS. 4a and 4b show a plasma and repelled medium particles.
Figure 4B:
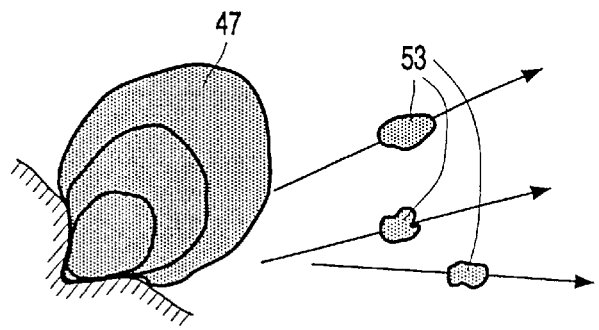

The radiation source unit further comprises a high-power laser 40, for example, an Nd-YAG laser which supplies laser pulses at a frequency of, for example, 10 Hz and at a pulse duration of, for example, 8 ns and with an energy content of 0.45 Joule. The optical frequency of the laser radiation may be doubled in known manner so that laser radiation with a wavelength of the order of 530 nm is obtained. An excimer laser, for example a Kr-F laser emitting at a wavelength of 248 nm, may be alternatively used as a laser source. The beam 41 emitted by the laser 40 enters, through a window 43, into the wall of the source space 34. This beam is focused by a lens system 42, illustrated by a single lens element, to a radiation spot 45 in a position 46 in a plane which substantially coincides with the laser-facing surface 36 of the tape 33. The pulsed beam 42 is each time substantially focused on a part of the tape which is instantaneously at the position 46. The radiation spot 45 has a diameter of, for example, 10 $\mu$m. As a result of the extremely high energy density, for example, of the order of $10^{21}$ $W/m^3$ of the laser beam at the bombarded area on the tape, this area partly explodes so that material, for example, metal particles are repelled from the tape. The repelled particles constitute a plasma, as is indicated in FIGS. 4a and 4b.

In these Figures, the reference numeral 36 denotes the bombarded surface of the tape 33 and the reference numeral 41 denotes the laser beam. The plasma is denoted by the reference numeral 47. This plasma reaches a temperature corresponding to an energy of the order of several tens of eV. Then, EUV radiation is generated at a wavelength in the range of several nm to several tens of rm. The wavelength of the generated radiation is dependent on the process parameters, such as the material of the tape 33. FIG. 4a illustrates the situation immediately after the laser beam has bombarded an area on the tape. At that instant, energy-rich ions 51 and atoms 52 are repelled from the plasma. A few moments later, hot pieces of metal 53, or clusters of metal particles, are evaporated, as is shown in FIG. 4b. For further particulars about the way and conditions in which EUV radiation is formed, reference is made to the above-mentioned article: "Characterization and control of laser plasma flux parameters for soft X-ray projection lithography".

Figure 5:
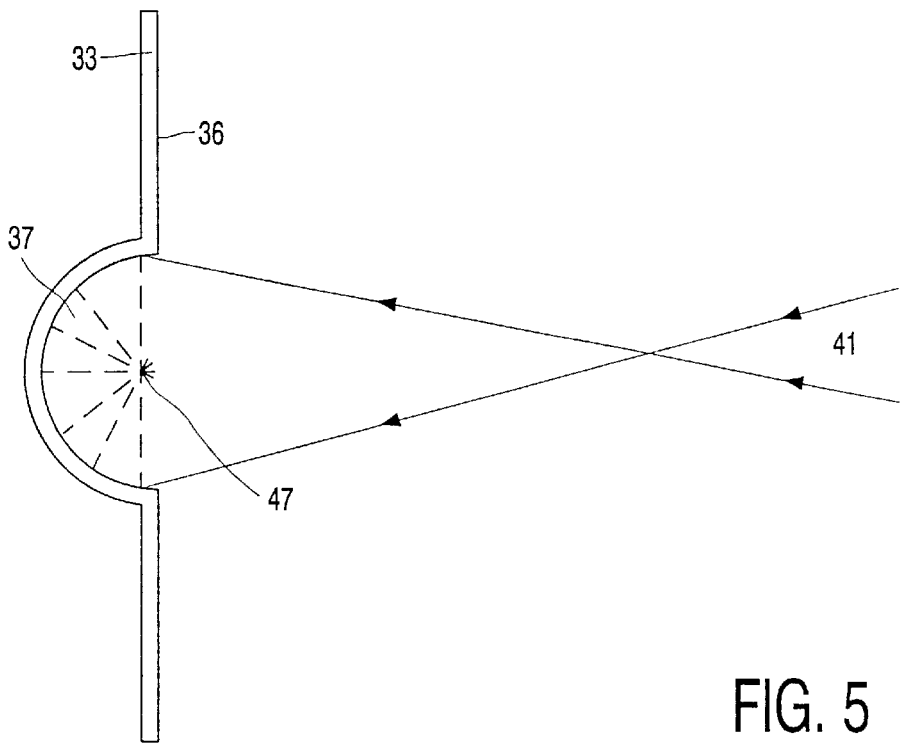
FIG. 5 shows a part of a tape-shaped medium to be irradiated.

According to the invention, the surface 36 of the tape 33 is provided with pits 37, in which the width of these pits is, for example approximately equal to the cross-section of the laser beam at the area of the tape, as is shown in FIG. 5. A cross-section in this Figure shows a small part of the tape 33 in which a pit is present. As is shown in FIG. 5, the tape may have a constant small thickness and the pit is formed by a local protuberance of the tape. The pit may alternatively have the shape of a local indentation in a thicker tape. The pits may be cylindrical or spherical.

Due to this shape of the local surface of the tape which is irradiated, the plasma formed there is concentrated in a smaller volume, so that the plasma has a considerably higher density and temperature than when using a flat tape as a plasma-forming medium. Due to the higher density and temperature, the emitted EUV radiation has a considerably higher intensity than in known EUV metal plasma radiation sources.

In addition to the high intensity gain, the use of the tape with pits as a plasma-forming medium provides another advantage which is not less important. Due to the pit structure, the ions 39, atoms 41 and the metal pieces 42 are also concentrated, i.e. the spatial angle at which these particles are repelled is reduced considerably. This provides the possibility to collect these particles within the source space by means of a particle collector, or receptacle 48, arranged within this space. The tape 36 may consist of various metals such as iron, tin or carbon. Instead of a metal, another solid material may be used as a medium. The requirements imposed on such a material are that it should form an EUV emitting plasma upon bombardment with a high power laser beam and can be brought to a shape which is suitable for transport through the source space.

Figure 6:
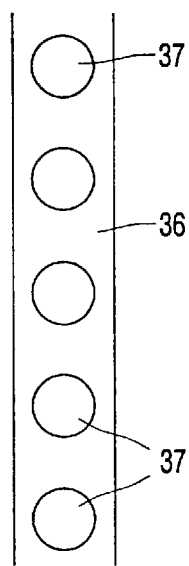
FIGS. 6, 7 and 8 show different embodiments of this medium.
Figure 7:
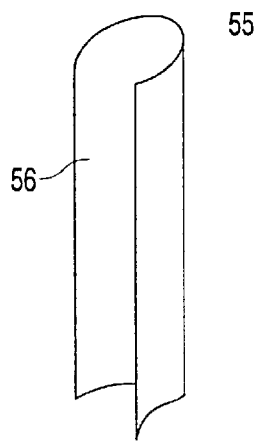
Figure 8:
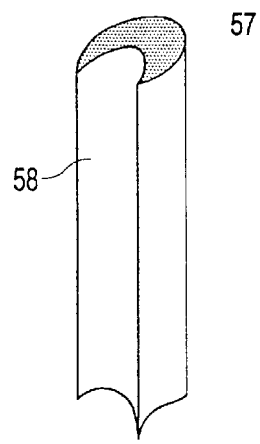

As regards the shape of the medium, there are various possibilities, as is illustrated in FIGS. 6, 7 and 8. FIG. 6 is an elevational view, in the direction of the laser beam, of the above-mentioned strip or tape 33 provided with the pits 37. When this type of tape is used, an extra provision may be made in the radiation source unit so as to ensure that a laser pulse each time impinges upon a pit. As is shown in FIG. 3, the transport device can be synchronized with the laser driver via an electronic circuit 50 comprising a delay element, so that a laser pulse is formed at the instant when a pit 37 arrives at the position 46.

FIG. 7 is a perspective view of a medium in the form of a bent tape 55 which is transported through the source space in such a way that the concave side 56 faces the laser. This embodiment of the medium provides the advantage that each laser pulse automatically impinges upon a tape section of the desired concave shape.

This also applies to the medium shown in FIG. 8. This medium has the shape of a concave wire 57 whose concave surface 58 must face the laser beam upon transport through the source space 34.

The wall of this space is provided with one or more apertures (not shown) through which the generated EUV radiation can exit. One or more mirrors 49 for collecting, concentrating and directing the generated EUV radiation may be arranged in this space. Alternatively, such mirrors may be arranged outside the space so as yet to concentrate and direct the EUV radiation exiting from this space. The number of mirrors required is dependent on the percentage of the EUV radiation which must be collected and used and is emitted by the plasma in all directions.

In the radiation source unit described, the problem may occur that the metal elements 51, 52 and 53 present in the source space 34 absorb EUV radiation which may reach other spaces in the apparatus via the apertures for passing EUV radiation. These particles may then damage the mirrors arranged in these spaces. This is an important problem, notably in lithographic projection apparatuses because a reduced reflection of the mirrors, whereby less radiation can reach the mask and notably the substrate, has a direct influence on an important performance parameter of such an apparatus, namely the rate at which substrates can be illuminated.

This problem can be eliminated, or at least sufficiently reduced, by passing a flow of rare gas through the source space, parallel to the direction of movement of the medium 33.

Figure 9:
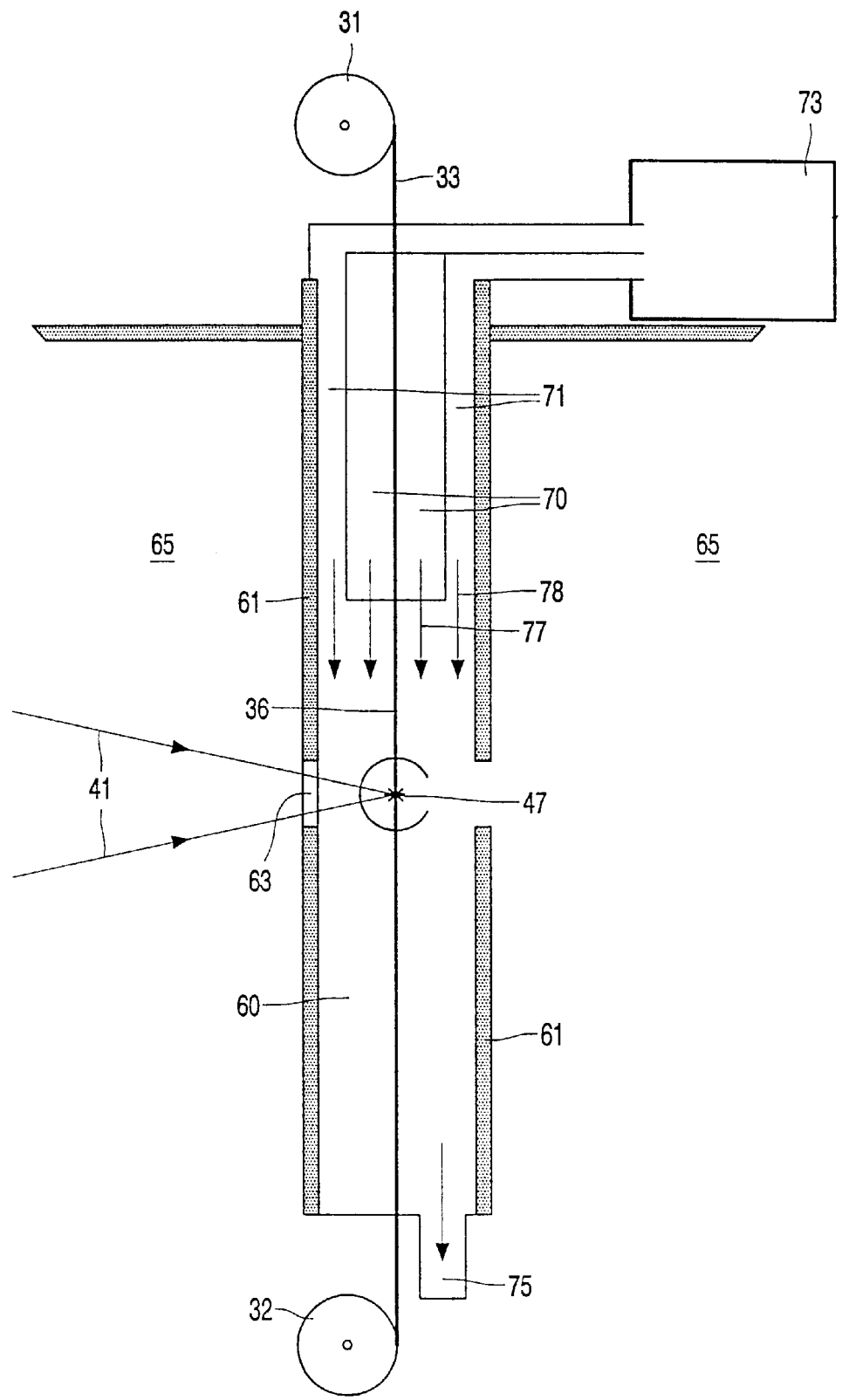
FIGS. 9, 10 and 11 show different embodiments of the radiation source unit in which a rare gas flow is used.

FIG. 9 shows a first embodiment of a radiation source unit in which this is realized. In this Figure, the elements corresponding to those in FIG. 3 are denoted by the same reference numerals. Furthermore, the components of the radiation source unit which are not important for the present invention are no longer shown in this Figure and subsequent Figures. In FIG. 9, the reference numeral 61 denotes the wall of a source space 60 which has the shape of, for example, a cylinder and through which the solid medium 33 is moved. This wall is provided with, for example, a narrow aperture 63 having a diameter of, for example, 2.5 mm, via which the pulsed laser beam 41 can enter the space 60. The generated EUV radiation can leave the source space 60, for example, via this aperture or other apertures (not shown) and enter a space 65. In this space, which is only shown diagrammatically and in which a high vacuum of, e.g., $10^{-4}$ mbar is maintained by means of the vacuum pump denoted by the reference numeral 35 in FIG. 3, the EUV radiation is guided towards the mask via the mirrors of the illumination system. The space 65 may also be filled with a rare gas such as helium, or with hydrogen at a low pressure of, for example $10^{-1}$ mbar.

A flow 77, 78 of rare gas, for example helium, is introduced into the source space 60 so that the helium flow is parallel to the direction of movement of the tape 33. To this end, the source space has a tube 70 which communicates with a helium outlet, for example, in the form of a tank 73. This tube has a diameter of, for example, 5 mm. A vacuum pump 75 connected to the source space ensures that a continuous flow of helium is maintained and that the helium pressure in the source space will not exceed, for example, $10^{-1}$ mbar. At this low helium pressure, the generated EUV radiation is not absorbed. The tape 33 is now embedded in a tubular and viscous flow of helium which has a sufficient suction power. As a result, the medium particles are enclosed within the helium column and are taken along by the helium flow and transported out of the source space. The tube 70 ensures that the helium flow is a laminar flow so that the helium gas and the medium particles present therein cannot flow back.

Due to the interaction of the tape 33 with the helium flow, the desired flow profile of the helium flow may be disturbed. To prevent this, a second tube 71 connected to the helium tank 73 is preferably arranged in the source space 60, so that a second helium flow 78 is established coaxially with the first flow 77. The flow profile can be restored again by means of the second flow.

Instead of helium, another rare gas may be used for draining water vapor and excess water droplets from the source space. An example of another gas is argon having larger molecules than those of helium so that an argon flow has a better suction power than helium. However, argon absorbs more EUV radiation than helium. In the choice of the gas, a compromise must be made between the minimal absorption and the maximal suction power.

Figure 10:
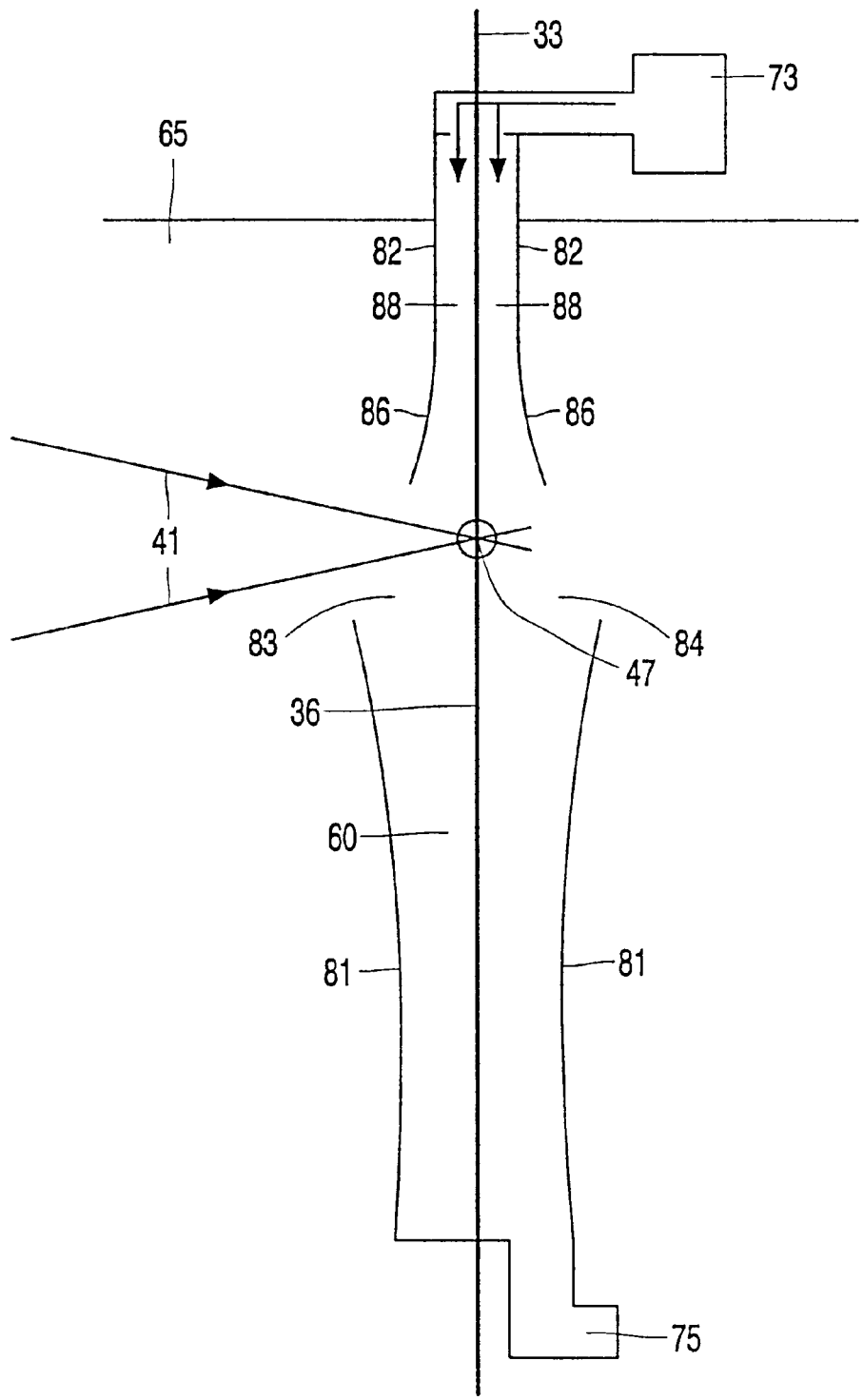

FIG. 10 is a cross-section of a part of a second embodiment of the radiation source unit in which a rare gas flow is used. This embodiment differs from that in FIG. 9, inter alia, in that the source space 60 has a smaller diameter, for example 5 mm, and consists of three parts. A wall 81 surrounds the lower part. The upper part is closed by the wall 82 of the tube 88 surrounding the tape 33 for the supply of the rare gas. The central part 85 of the source space, at the area of the radiation path of the laser beam 41, communicates with the ambience. At the area of this central part, the walls 81 and 82 are slightly bent outwards so that a so-called ejector configuration, or geometry, is obtained. The combination of the vacuum pump 75 and its specific wall shape at the area of the central part of the source space operates as a so-called ejector pump or jet pump. Such a pump prevents helium or other particles from leaking to the ambience of the source space because it also sucks up possible particles present in this ambience and removes them. The open central part 85 of the source space 60 only needs to have such a height that the converging laser beam 41 can enter the source space in an unhindered way.

Helium gas or another rare gas is supplied from a helium inlet 73 between the tape 33 and the wall 82. This helium gas is sucked downwards by the vacuum pump 75 in the form of a laminar flow and takes along the medium particles. Due to the jet pump configuration of the source space, migration of medium particles and loss of helium gas to the high-vacuum space 65 is prevented, and this to a stronger extent than is the case in the embodiment of FIG. 9. In this way, the helium gas pressure in the space 65 may be further reduced.

To be able to operate as a jet pump, the straight part of the source space 60 must have a small diameter, for example, 5 mm. Then, the laser beam must be focused substantially on the position where the plasma-forming medium passes. Then there is a greater risk that the beam radiation does not impinge upon a desired pit in this medium, as compared with the case where the laser beam is focused at some distance from said position and hence this beam has a larger diameter at this position. Moreover, when focusing the laser beam on said position, the laser radiation has a large energy density at that position.

Figure 11:
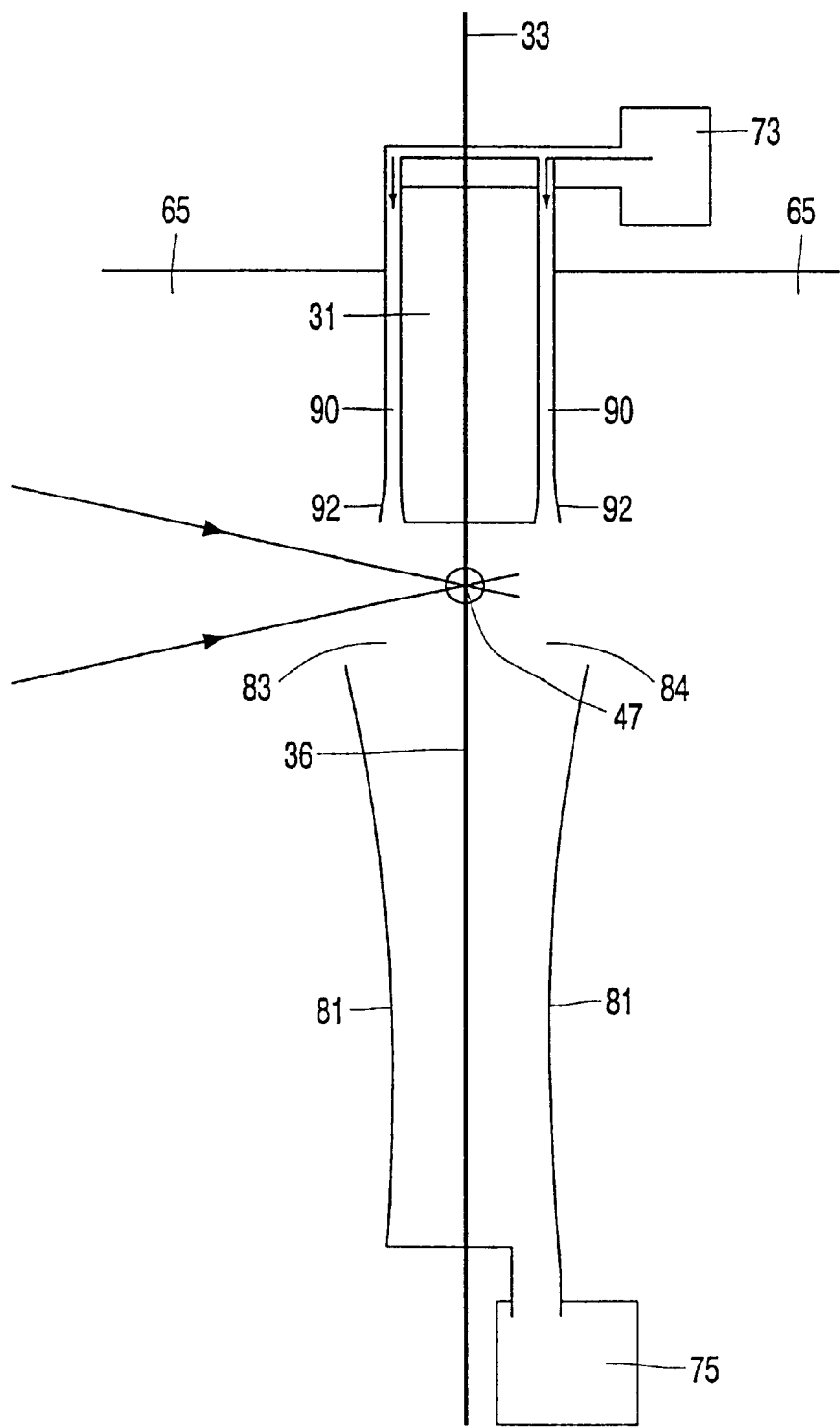

This possible problem is mitigated by the embodiment shown in FIG. 11. This embodiment also comprises a jet pump. However, the inlet tube 90 now has an annular cross-section, with the width of the ring, for example 1 mm, being considerably smaller than its internal diameter which is, for example, 10 mm. The wall portions 92 and the upper parts of the wall 81 again constitute an ejector configuration. The gas curtain supplied through the tube 90 ensures that the medium particles remain entrapped and are drained. The jet pump configuration ensures that the gas curtain moves downwards at a great velocity and prevents rare gas from leaking to the high-vacuum space 65. Since the jet tube has an annular cross-section, the source space 60 may have a relatively large diameter so that the laser beam can be focused at some distance from the position where the water droplets pass so that the risk of missing a droplet will thus become smaller. The embodiment of FIG. 11 thus combines the advantages of the embodiment of FIG. 10 with those of the embodiment of FIG. 9.

For the theoretical background and details about ejector pumps, reference is made to the article "Exit Flow Properties of Annular Jet-Diffluser Ejectors" in Journal of the Chinese Society of Mechanical Engineers, Vol. 18, No. 2, pp. 1113–125, 1997.

EUV radiation sources may not only be used in lithographic projection apparatuses but also in EUV microscopes having a very high resolving power. The radiation path of the EUV radiation in such a microscope must be in a high vacuum. To prevent the vacuum from being attacked from the radiation source and from contaminating the optical components, the invention and its various described embodiments may be used to great advantage.

It has been noted hereinbefore that EUV radiation is also known as soft X-ray radiation because its wavelength is close to that of real X-ray radiation having a wavelength of the order of 1 nm or less. It has also been noted that the wavelength of the radiation generated with the described radiation sources is dependent on, inter alia, the medium used. For generating X-ray radiation, similar radiation sources, with similar problems as for generating EUV radiation may therefore be used. For this reason, the present invention may also be used to great advantage in X-ray sources and this invention also relates to these sources and apparatuses such as X-ray microscopes or X-ray analysis apparatuses, hence the use in the claims of the term extremely short-wave radiation which is understood to be EUV radiation and X-ray radiation.

What is claimed is:

1. A method of generating extremely short-wave radiation, in which a solid medium is transported through a vacuum space such that a different part of the solid medium in the vacuum space is irradiated with a pulsed and focused energy-rich laser beam, said part of the solid medium being partly converted into a plasma emitting extremely short-wave radiation, wherein the solid medium, viewed in the direction of irradiation, has a concave shape at least at the area of the parts to be irradiated, and wherein the solid medium is passed through a tube containing a viscous flow of rare gas that is transported parallel to the direction of the solid medium.

2. A method as claimed in claim 1, characterized in that use is made of a tape-shaped medium which is provided with pits.

3. A method as claimed in claim 1, characterized in that use is made of a wire-shaped medium having a concave cross-section.

4. A method as claimed in claim 1, characterized in that use is made of a metal medium.

5. A method of generating extremely short-wave radiation, in which a solid medium is transported through a vacuum space such that a different part of the solid medium in the vacuum space is irradiated with a pulsed and focused energy-rich laser beam, said part of the solid medium being partly converted into a plasma emitting extremely short-wave radiation, wherein the solid medium, viewed in the direction of irradiation, has a concave shape at least at the area of the parts to be irradiated, and wherein the solid medium is passed through a tube containing at least two viscous flows of rare gas that are passed through a part of the vacuum space in which a part of the medium, which is not yet irradiated, propagates.

6. A method as claimed in claim 5, characterized in that helium gas is used as a rare gas.

7. A method of manufacturing a device, in which the dimensions of the smallest details are smaller than 0.25 $\mu$m, on a substrate, in which method different layers of the device are formed in successive steps by imaging by means of EUV radiation, for each layer, first a specific mask pattern on the substrate coated with a radiation-sensitive layer and by subsequently removing material from, or adding material to, areas marked by the mask image, characterized in that the EUV radiation is generated by means of the method as claimed in claim 1.

8. An extremely short-wave radiation source unit comprising:
- a source space connected on a first side to a vacuum pump;
- a transport device for transporting a solid medium through the source space;
- a pulsed high-power laser;
- an optical system for focusing the laser beam supplied by the laser within the source space onto the solid medium, wherein the solid medium which, viewed in the direction of the laser beam and at least at given positions, has a concave shape; and
- a tube in the source space through which both the solid medium and a viscous flow of rare gas pass in a parallel direction.

9. An extremely short-wave radiation source unit as claimed in claim 8, characterized in that the transport device is adapted to transport a tape-shaped medium having pits which, viewed in the transport direction, are located one behind the other.

10. An extremely short-wave radiation source unit as claimed in claim 8, characterized in that the transport device is adapted to transport a tape-shaped medium which is bent widthwise, the concave side facing the laser beam.

11. An extremely short-wave radiation source unit as claimed in claim 8, characterized in that the transport device is adapted to transport a concave wire whose concave side faces the laser beam.

12. An extremely short-wave radiation source unit as claimed in claim 8, characterized in that the medium consists of a metal.

13. An extremely short-wave radiation source unit as claimed in claim 8, characterized in that the source space is connected on a second side, opposite the first side, to a rare gas inlet for establishing a viscous flow of rare gas in the source space enveloping the medium, which flow is parallel to the direction of movement of the medium.

14. An extremely short-wave radiation source unit as claimed in claim 13, in which the source space is enclosed by a wall having apertures for causing the laser beam to enter into and exit from the source space and for causing the generated extremely short-wave radiation to exit from the source space, characterized in that a tube is arranged in the source space on the second side of the source space and parallel to the direction of movement of the medium, which tube is connected to said inlet for establishing the viscous flow of rare gas.

15. An extremely short-wave radiation source unit as claimed in claim 14, characterized in that a second tube is arranged parallel to the first tube in the source space, which second tube is connected to said inlet for establishing a second viscous flow of rare gas parallel to the direction of movement of the medium.

16. An extremely short-wave radiation source unit as claimed in claim 13, characterized in that the source space is formed by a first closed part on the first side, a second closed part on the second side and a central part which communicates with the ambience, in that the wall of the second source space part is formed by a tube which is connected to said rare gas inlet, and in that the wall of the tube and the wall of the first source space part have such a shape at the area of the central part of the source space that they constitute an ejector geometry.

17. An extremely short-wave radiation source unit as claimed in claim 13, characterized in that the source space is formed by a first closed part on the first side, a second closed part on the second side and a central part which communicates with the ambience, in that the wall of the second source space part is formed by an annular tube which is connected to said rare gas inlet, and in that the wall of the tube and the wall of the first source space part have such a shape at the area of the central part of the source space that they constitute an annular ejector geometry.

18. A lithographic projection apparatus for imaging a mask pattern on a substrate provided with a radiation-sensitive layer, which apparatus comprises an illumination system for illuminating the mask pattern and a projection system for imaging the illuminated mask pattern on the substrate, the illumination system comprising an EUV radiation source, while the optical components of the illumination system and those of the projection system are present in a vacuum space, characterized in that the EUV radiation source is a radiation source unit as claimed in claim 8.

19. A method of generating extremely short-wave radiation, in which a tape is transported through a vacuum space such that a plurality of parts of the tape are irradiated with a pulsed and focused energy-rich laser beam in the vacuum space, each irradiated part of the tape being partly converted into a plasma emitting extremely short-wave radiation, wherein the tape comprises a curved cross section such that a concave side of the tape faces the direction of irradiation.

* * * * *